(12) United States Patent
Oyoshi et al.

(10) Patent No.: US 6,383,716 B1
(45) Date of Patent: May 7, 2002

(54) STABLE PHOTOSENSITIVE RESIN COMPOSITION

(75) Inventors: Takeshi Oyoshi; Yoshifumi Araki, both of Fuji (JP)

(73) Assignee: Asahi Kasei Kabushiki Kaisha, Tokyo (JP)

(*) Notice: Subject to any disclaimer, the term of this patent is extended or adjusted under 35 U.S.C. 154(b) by 0 days.

(21) Appl. No.: 09/673,573

(22) PCT Filed: Feb. 19, 1999

(86) PCT No.: PCT/JP99/00741
§ 371 Date: Oct. 18, 2000
§ 102(e) Date: Oct. 18, 2000

(87) PCT Pub. No.: WO00/49462
PCT Pub. Date: Aug. 24, 2000

(30) Foreign Application Priority Data

Aug. 22, 1997 (JP) .............................................. 9-226084
Aug. 22, 1997 (JP) .............................................. 9-226085

(51) Int. Cl.[7] .............................................. G03F 7/028

(52) U.S. Cl. .................................. 430/281.1; 430/270.1

(58) Field of Search ........................... 430/281.1, 270.1

(56) References Cited

U.S. PATENT DOCUMENTS

| 3,274,258 | A | | 9/1966 | Odenweller | 260/609 |
|---|---|---|---|---|---|
| 5,032,498 | A | * | 7/1991 | Rody et al. | 430/512 |
| 5,300,544 | A | | 4/1994 | Galbo et al. | 524/100 |
| 5,554,760 | A | | 9/1996 | Winter et al. | 548/260 |
| 6,281,293 | B1 | * | 8/2001 | Fujii | 525/233 |

FOREIGN PATENT DOCUMENTS

| EP | 0738718 A1 | 10/1996 |
|---|---|---|
| EP | 0861847 | 9/1998 |
| EP | 0890610 A1 | 1/1999 |
| JP | A6295310 | 5/1987 |
| JP | A683058 | 3/1994 |
| JP | A1160965 | 3/1999 |
| JP | 11065104 | 6/1999 |

* cited by examiner

*Primary Examiner*—John S. Chu
(74) *Attorney, Agent, or Firm*—Birch, Stewart, Kolasch & Birch, LLP

(57) ABSTRACT

The present invention provides a photosensitive resin composition containing bis(3,5-di-t-butyl-4-hydroxy-benzyl) sulfide. The photosensitive resin composition of this invention, as it contains a specific stabilizer, is resistant against tinting and gelation by heat, excellent in storage stability, not inhibitory to photopolymerization reactions, and thermally stable.

3 Claims, No Drawings

STABLE PHOTOSENSITIVE RESIN COMPOSITION

This application is the national phase under 35 U.S.C. § 371 of PCT International Application No. PCT/JP99/00741 which has an International filing date of Feb. 19, 1999, which designated the United States of America.

TECHNICAL FIELD

The present invention relates to a photosensitive resin composition, more particularly to a photosensitive resin composition which is thermally stable, causes no improper development or discoloration with the lapse of time, and has excellent storage stability.

BACKGROUND ART

"Photosensitive resin" referred to in the present invention is such a resin that a photopolymerization initiator contained therein generates a radical on receiving energy such as light or electron beam, allowing a radical crosslinking reaction to take place and selectively proceed at the light-irradiated portion to cause a change of solubility or dispersibility of the resin in solvents or a change of mechanical strength of the resin.

These resins generally contain an unsaturated compound and a photopolymerization initiator and are converted to polymeric resins after polymerization. In actual use of such resins, by taking advantage of the above property, the light-irradiated portion and the non-irradiated portion are treated with a developing solution (generally a solvent or an aqueous surfactant-containing solution) to remove the non-polymerized portion. (This treatment is hereinafter called development.)

These resins are thermally unstable because of their high reactivity. For instance, in case an article containing this type of resin is produced by a process requiring a high-temperature treatment, or is kept in storage for a long time, a radical crosslinking reaction takes place and proceeds in the resin throughout, even at the portion where it is desired to selectively prevent the polymerization from taking place, making it unable to perform normal development. In order to avoid such unfavorable phenomenon, various ideas have been proposed, such as lowering the treating temperature in the process or lowering the storage temperature. It has also been attempted to add a heat stabilizer to the resin to thereby maintain stability.

For instance, JP-A-62-95310 proposes use of hindered phenols (sterically hindered monophenols) or their thio-compounds.

However, the stabilizers which have so far been disclosed to be used for photosensitive resins and the like are unsatisfactory in their thermal stabilization effect. Some of those stabilizers are raised in their effect as their content is increased, but such stabilizers, in use, are reduced in sensitivity and prone to become substantially unserviceable, and are also subject to restrictions in relation to the process or compounding with the photosensitive resin.

It is also common practice to further contain a thermoplastic elastomer in a stabilizer-containing photosensitive resin composition for improving handling qualities of the composition. However, incorporation of a thermoplastic elastomer, which in itself is high in molecular weight, is liable to cause improper development.

DISCLOSURE OF THE INVENTION

The object of the present invention is to provide a photosensitive resin composition having high photopolymerization reactivity and thermal stability.

As a result of extensive studies for solving said problems in the prior art, the present inventors found that use of bis(3,5-di-t-butyl-4-hydroxybenzyl) sulfide (hereinafter referred to as BBHS in some cases) as a stabilizer produces a surprising stabilizing effect specifically for photosensitive resins, and further, additional use of 2-t-butyl-6-(3-t-butyl-2-hydroxy-5-methylbenzyl)-4-alkylphenyl acrylate (hereinafter referred to as BBHMAA in some cases) in combination with BBHS provides further improvement of the stabilizing effect, and that especially in a system containing a thermoplastic elastomer, the composition is made even more stable by containing a specific phosphorus compound in the composition. The present invention has been attained on the basis of the above finding.

Thus, the present invention provides:

(1) A photosensitive resin composition containing bis(3,5-di-t-butyl-4-hydoxybenzyl) sulfide.

(2) A photosensitive resin composition described in (1) above, also containing 2-t-butyl-6-(3-t-butyl-2-hydroxy-5-methylbenzyl)-4-alkylphenyl acrylate.

(3) A photosensitive resin composition described in (1) or (2) above, further containing a thermoplastic elastomer and at least one phosphorus compound selected from the group consisting of monoisodecyl phosphate, monomethyl acid phosphate, dimethyl acid phosphate, mono(2-(meth)acryloyloxyethyl) acid phosphate, bis(2-(meth)acryloyloxyethyl) acid phosphate, tri(2-(meth)acryloyloxy-ethyl) acid phosphate and tetrakis(2,4-di-t-butylphenyl)-4,4'-biphenylene diphosphonate.

BEST MODE FOR CARRYING OUT THE INVENTION

The photosensitive resin compositions contain an unsaturated compound and a photopolymerization initiator, and other substances such as polymer, plasticizer, colorant, etc., which are added as required according to the purpose of use. For mixing these substances, suitable methods can be employed, such as melting the solid components in an extruder and injecting the liquid components thereinto, or mixing together all of the substances in a Banbury mixer or a kneader.

BBHMAA used in the present invention is a compound represented by the following structural formula:

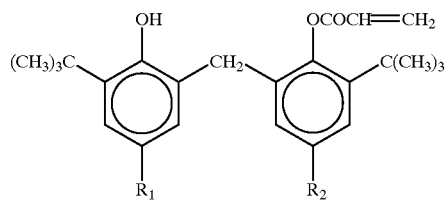

wherein $R_1$ and $R_2$ both represent an alkyl group. Because of high stabilizing effect, a compound of the above formula wherein both of $R_1$ and $R_2$ are methyl group (this compound 2-t-butyl-6-(3-t-butyl-2-hydroxy-5-methylbenzyl)-4-methylphenyl acrylate being hereinafter abbreviated as BBHMMA in some cases) is preferably used.

The content of the stabilizer BBHS is 0.01 to 5 parts by weight, preferably 0.1 to 0.9 parts by weight, per 100 parts by weight of the composition. The content of BBHMAA is 0 to 5 parts by weight, preferably 0.01 to 5 parts by weight, per 100 parts by weight of the composition, more preferably equal to the content of BBHS. If the content of these stabilizers is below the above-defined ranges, the produced effect falls short of being satisfactory. If their content exceeds the above-defined ranges, there can not be obtained a greater effect than a certain level, and in this case, sensitivity of the composition may be lower.

Especially in the system containing a thermoplastic elastomer, additional incorporation of a phosphorus compound such as mentioned in (3) above is conducive to further promotion of the thermal stabilizing effect to improve the developing characteristics of the composition.

The stabilizer according to the present invention can be contained in the composition by a known method. For example, the stabilizer may be dissolved or uniformly dispersed in the liquid component so that it may be injected with the liquid component. In case the stabilizer is liquid, it may be injected separately from the liquid component, and if the stabilizer is solid, it may be supplied together with the solid component. Generally, the stabilizer is added before the process temperature rises up, but in order to enhance keeping quality of the final product, the stabilizer may be contained in the product by a specific method such as by impregnation.

As the unsaturated compound contained in the photosensitive resin composition, any compound can be used so far as it has a double-bond in the molecule and is liquid or solid at the working temperature. Preferably, the acrylic acid or methacrylic acid compounds having high reactivity and also high compatibility with various compounds are used, and the esters of acrylic or methacrylic acids are more preferably used because of lower toxicity and smaller metal corrosiveness.

Examples of such compounds include alkyl (meth)acrylate, cycloalkyl (meth)acrylate, halogenated alkyl (meth)acrylate, alkoxyalkyl (meth)acrylate, hydroxyalkyl (meth)acrylate, aminoalkyl (meth)acrylate, tetrahydrofurfuryl (meth)acrylate, allyl (meth)acrylate, glycidyl (meth)acrylate, benzyl (meth)acrylate, phenoxy (meth)acrylate, alkylene glycol di(meth)acrylate, polyoxyalkylene glycol di(meth)acrylate, and alkylpolyol poly(meth)acrylate. To be more specific, they include diethylene glycol di(meth)acrylate, tetraethylene glycol di(meth)acrylate, hexamethylene di(meth)acrylate, nonamethylene di(meth)acrylate, polybutadiene diacrylate, polyisoprene diacrylate, trimethylolpropane tri(meth)acrylate, glycerin tri(meth)acrylate, pentaerythritol tetra(meth)acrylate, 2-(meth)acryloyloxyethyl-2-hydroxyethyl phthalate, 2-(meth)acryloyloxyethyl-2-hydroxypropyl phthalate, 1-(meth)acryloyloxy-2-hydroxy-3-phenoxypropane, phenoxyethyl (meth)acrylate, phenoxytetraethylene glycol (meth)acrylate, ethoxylated bisphenol A di(meth)acrylate, bis-(meth)acryloyloxyethylhydroxyethyl isocyanurate, and tris(meth)acryloyloxyethyl isocyanurate, In the specification, "(meth)acrylate" denotes "acrylate or methacrylate", and "(meth)acryloyl" denotes "acryloyl or methacryloyl".

The content of the unsaturated compound is 1 to 95% by weight, preferably 3 to 80% by weight, based on the whole photosensitive resin composition. Too high of a content induces an unnecessary rise of temperature or chain reaction by polymerization heat in the reaction, causing advancement of crosslinking even to the area where light does not reach. Too low of a content is causative of a slow reaction or insufficiency of the difference in solubility in the solvent or mechanical strength from the unreacted portion, making it difficult to accomplish accurate development.

Various known types of photopolymerization initiators can be used in the present invention although various organic carbonyl compounds, especially aromatic carbonyl compounds are preferred. Examples of such compounds are shown below.

1) Benzoin and its derivatives represented by the formula (1), such as benzoin ethyl ether, benzoin n-propyl ether, benzoin isopropyl ether and benzoin isobutyl ether.

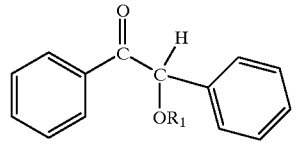

(1)

wherein $R_1$ is a hydrogen atom or an alkyl group such as methyl, ethyl, isopropyl or isobutyl.

2) Phenyl ketones represented by the formula (2), such as 2,2-dimethoxy-2-phenylacetophenone.

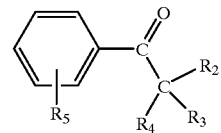

(2)

wherein $R_2$, $R_3$, $R_4$ and $R_5$ may be identical or different and represent independently a hydrogen atom, a halogen atom, an alkyl group, an alkoxyl group, a hydroxyl group, a phenyl group, an alkylthio group, a morpholino group or the like.

3) Benzophenone and its derivatives represented by the formula (3), such as methyl-O-benzoyl benzoate.

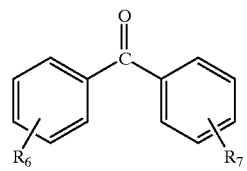

(3)

wherein $R_6$ and $R_7$ may be identical or different and represent independently a hydrogen atom, an alkyl group, an alkoxyl group, a carboxyl group, an alkoxycarbonyl group, an alkylthio group, an amino group or the like.

These photopolymerization initiators may be used either singly or as a combination of two or more.

The content of the photopolymerization initiator is not less than 0.1 part by weight and not more than 30 parts by weight per 100 parts by weight of the photosensitive resin composition. If the content of the photopolymerization initiator is less than 0.1 part by weight, the photo-setting properties of the whole composition prove to be defective, while if the content exceeds 30 parts by weight, transmission of light may be hindered to induce photo-setting of the surface alone.

The thermoplastic elastomers usable in the present invention include thermoplastic elastomer-like block copolymers such as styrene-butadiene block copolymer, styrene-isoprene block copolymer and styrene-butadiene-acrylic ester copolymer; polyurethane-based thermoplastic elastomers, polyester-based thermoplastic elastomers, and polyamide-based thermoplastic elastomers.

These thermoplastic elastomers may contain as a plasticizer an unsaturated diene compound such as liquid polybutadiene, liquid polyisoprene or a modified unsaturated diene compound such as maleate-modified polybutadiene, acrylate-modified polybutadiene, epoxy-modified polybutadiene, for the purpose of imparting softness to the elastomers.

The content of the thermoplastic elastomer is 0 to 95% by weight, preferably 5 to 90% by weight, based on the whole resin composition. Too high elastomer content may cause an unnecessary rise of viscosity of the photosensitive resin composition, while too low of a content may lead to unsatisfactory mechanical properties of the photo-set product, making it fragile.

The phosphorus compounds that can be used in the present invention for the purpose of improving stability include, for example, monoisodecyl phosphate, monomethyl acid phosphate, dimethyl acid phosphate, mono(2-(meth)-acryloyloxyethyl) acid phosphate, bis(2-(meth)acryloyloxyethyl) acid phosphate, tri(2-(meth)acryloyloxyethyl) acid phosphate, and tetrakis(2,4-t-butylphenyl)-4,4'-biphenylene diphosphonate. These compounds may be used either singly or as a combination of two or more.

The content of such a phosphorus compound(s) is 0.01 to 5 parts, preferably 0.05 to 1 part, per 100 parts by weight of the photosensitive resin composition. Too small of a content of this compound cannot derive its effect sufficiently. Use of this compound in an excess amount does not provide an extra effect and rather causes a drop of turbidity to give an adverse effect to the reproducibility of a negative at the time of photo-setting.

Quite surprisingly, use of such a phosphorus compound significantly improves the developing performance. Specifically, by use of an appropriate amount of this compound, it is possible to reduce the time required for developing an area of 1 mm to ⅓ or less.

In the photosensitive resin composition of the present invention, the conventional additives such as pigment, dye, microgel, surfactant, etc., may be contained within limits not prejudicial to the photosensitivity, developing performance and physical properties of the composition.

The present invention will be described in further detail with reference to the embodiments thereof.

1) Gelation Test

A composition was prepared by blending 5 parts by weight of a polybutadiene diacrylate (BAC-45 produced by Osaka Yuki Kagaku KK), 1 part by weight of an aliphatic diacrylate (C-2000 produced by THERTMER), 2 parts by weight of dioctyl fumarate and 10 parts by weight of a maleate-modified polybutadiene (MM-1000-80 produced by Nippon Sekiyu Kagaku KK) as the unsaturated compounds used in Referential Example 1(2) described below, 2 parts by weight of 2,2-dimethoxyphenylacetophenone as photopolymerization initiator, and 5 parts by weight of the sulfonic group-containing polyurethane (polymer moiety of the photosensitive resin composition) obtained in Referential Example 1(1) described below for preventing separation of the unsaturated compounds at high temperatures. Then a predetermined amount of a stabilizer was dissolved in the composition. This sample was put into a test tube with a glass rod placed therein, and left in a nitrogen atmosphere of 140° C. The test tube was observed every hour, and the time required till the glass rod became immobile was decided as gelation time.

2) Storage Stability Test

The photosensitive resin compositions prepared by using as a main constituent the composition obtained in Referential Example 1(2) described below and adding the stabilizers as shown in Table 2 were kept under atmospheric pressure at the temperatures of 20° C. and 40° C., and their developing behavior (developing speed) with time was observed. Development was conducted in an aqueous treating solution, and the time required till the time for developing of an area of 1 mm became doubled, or more, was expressed as a development failure time. Measurement was made at the points of passage of one month, 3 months, 6 months and 12 months after the start of the test. In practical use, it is desirable that the composition is stable for more than half a year, preferably more than 2 years at 20° C.

As the aqueous treating solution, a mixed solution of 2 parts by weight of sodium borate, 2 parts by weight of octylphenoxypolyoxyethylene ether and 100 parts by weight of water was used.

3) Accelerated Storage Stability Test

The photosensitive resin composition was kept at 90° C., 110° C. and 140° C. and its developing behavior (developing speed) with test was observed. The time required till the time for developing of an area of 1 mm became doubled or more was expressed as a development failure time.

Since temperature dependency of storage stability conforms to the Arrhenius' law, this test is designed to we predict long-time storage stability in a short time by conducting the test at high temperatures. The desirable practical level in this test is over the level of 72 hours at 90° C., and this level is equivalent to storage stability of two years or more.

4) Determination of Sensitivity

The photosensitive resin composition was exposed to light via its PET film side having an adhesive layer, and after developing the uncured resin with an aqueous treating solution, thickness of the cured portion was measured and sensitivity was determined from this thickness. The sample which suffered 20% or more decrease of thickness as compared with Comparative Example 1 was marked x, the sample which was the same in thickness as or suffered less than 20% decrease of thickness compared with Comparative Example 1 was marked ○, and the sample which became thicker than Comparative Example 1 was marked ⊙. A near ultraviolet lamp having a peak wavelength at 370 nm was used for exposure. The developing solution used in the test was a mixture of 2 parts by weight of sodium borate, 2 parts by weight of octylphenoxypolyoxyethylene ether and 100 parts by weight of water.

Referential Example 1

(1) Synthesis of Sulfonic Acid Group-containing Polyurethane

To a 1,000 ml separable flask provided with a stirrer, a nitrogen inlet port and an outlet pipe, 296 g of sodium sulfoisophthalate dimethyl ester, 310 g of ethylene glycol, 0.43 g of N,N'-hexamethylenebis(3,5-di-t-butyl-4-hydroxyhydrocinnamylamide) (IRGANOX 1098 produced by CibaGeigy Corp.) and 0.43 g of zinc acetate were supplied and reacted in a nitrogen atmosphere at 200° C. for 5 hours, and then unreacted ethylene glycol was distilled away under reduced pressure to obtain a light-yellow sulfonic acid group-containing polyester diol having a hydroxyl group at the terminal. The number-average molecular weight of this product was determined to be 492 from measurement of hydroxyl number.

To a 3,000 ml separable flask provided with a stirrer, a nitrogen inlet port and an outlet pipe, 39.9 g of said sulfonic acid group-containing polyester diol, 377.7 g of a polyisoprene diol having a number-average molecular weight of 2,439 and possessing hydroxyl groups at both terminals (produced by Idemitsu Petrochemical Co., Ltd.) and 1.4 g of octylated diphenylamine (NOCRAC AD produced by Ouchi Shinko Kagaku KK) were supplied, and then 1,000 g of dimethylamide and 1,000 g of 2-chlorotoluene were added to form a homogeneous solution at 110° C.

Then 0.11 g of dibutyltin dilaurate and 0.34 g of stannous octoate were further added, and the mixture was reacted at 110° C. for 3 hours while dropping 43.1 g of xylylene diisocyanate, after which dimethylacetamide and 2-chlorotoluene were distilled away under reduced pressure to obtain a homogeneous and transparent sulfonic acid group-containing polyurethane.

(2) Preparation of Photosensitive Resin Composition 49.5 g of the sulfonic acid group-containing polyurethane obtained in (1) above was kneaded with 20 g of a styrene-isoprene block copolymer (CALIFLEX TR1107 produced by Shell Chemical Co.), 2 g of sodium laurylbenzenesulfonate, 5 g of a polybutadiene diacrylate (BAC-45 produced by Osaka Yuki Kagaku KK), 1 g of an aliphatic diacrylate (C-2000 produced by THERTOMER), 2 g of dioctyl fumarate, 2 g of 2,2-dimethoxyphenylacetophenone, 10 g of a maleate-modified polybutadiene (MM-1000-80 produced by Nippon Sekiyu Kagaku KK) and 7.5 g of N-ethyltoluene-sulfonamide by a press kneader in a nitrogen atmosphere at 150° C. to obtain a homogeneous and transparent photosensitive resin composition.

EXAMPLE 1 AND COMPARATIVE EXAMPLE 1

The photosensitive resin composition for the gelation test was kneaded with BBH and/or BBHMMA and/or another stabilizer in a kneader in the formulations shown in Table 1. Gelation test results of the obtained photosensitive resin compositions are shown in Table 1.

As is seen from Table 1, BBHS has a specific effect that can never be expected from hindered phenols known as a stabilizer for use in photosensitive resins, and further, its use in combination with BBHMMA can realize a phenomenal improvement of stability without reducing sensitivity.

EXAMPLE 2

1.2 part by weight of SSRS was kneaded with 100 parts by weight of the photosensitive resin composition of Referential Example 1(2), and the mixture was sandwiched between a PET film having an adhesive layer and another PET film having an anti-block coating and pressed to obtain a 3 mm thick photosensitive resin plate. The adhesive layer was formed by dissolving 14.3 parts by weight of TOUGH-PREN 912 (produced by Asahi Chemical Industry Co., Ltd.) and 0.6 part by weight of an addition product of trimethylolpropane (1 mole) and 4,4'-diphenylmethane diisocyanate (3 moles) in 38 parts by weight of ethyl acetate, 38 parts by weight of tetrahydrofuran and 24 parts by weight of cellosolve acetate, and coating the solution on the PET film with a knife coater to a post-drying coating weight of approximately 9 g/m². The same coating technique was used in the following Examples. The anti-block coating was formed by dissolving 4 parts by weight of polyvinyl alcohol (KH-17 produced by Nippon Synthetic Chemical Co., Ltd.) in 35 parts by weight of water and 15 parts by weight of isopropyl alcohol, and coating the solution on another PET film with a knife coater to a post-drying coating weight of approximately 2 g/m². This technique was also employed in the following Examples.

Evaluation results of the thus obtained photosensitive resin plate are shown in Table 3. As is seen from Table 3, the storage stability of this resin plate was 0.5 year or more at room temperature.

EXAMPLE 3

A photosensitive resin plate was made in the same way as in Example 2 except that 0.6 part by weight of BBHS and 0.6 part by weight of BBHMMA were kneaded with 100 parts by weight of the photosensitive resin composition of Referential Example 1(2) in a kneader. Evaluation results of this photosensitive resin plate are shown in Table 3. As is seen from Table 3, the storage stability of this resin plate was one year or more at room temperature.

EXAMPLE 4

A photosensitive resin plate was made in the same way as described above by further incorporating 0.3 part by weight of monoisodecyl phosphate (MIDP) in the photosensitive resin composition of Example 3. Evaluation results of this resin plate are shown in Table 3. As is seen from Table 3, storage stability was over the "desirable practical level" of 72 hours at 90° C. Also, developing time was reduced to ½ of that in Comparative Example 2.

EXAMPLE 5

A photosensitive resin plate was made in the same way as in Example 3 by further kneading 0.6 part by weight of monomethyl acid phosphate (MMAP) with the photosensitive resin composition of Example 3 in a kneader. Evaluation results of this resin plate are shown in Table 3. As is seen from Table 3, storage stability was over the desirable practical level of 72 hours at 90° C., and the developing time was reduced to ½ of that in Comparative Example 2.

EXAMPLE 6

A photosensitive resin plate was made in the same way as in Example 3 by further kneading 0.6 part by weight of dimethyl acid phosphate (DMAP) with the photosensitive resin composition of Example 3 in a kneader. Evaluation results of this resin plate are shown in Table 3. As is seen from Table 3, storage stability was over the desirable practical level of 72 hours at 90° C., and the developing time was reduced to ½ of that in Comparative Example 2.

EXAMPLE 7

A photosensitive resin plate was obtained in the same way as in Example 3 by further kneading 0.6 part by weight of mono(2-acryloyloxyethyl) acid phosphate (MAOAP) with the photosensitive resin composition of Example 3 in a kneader. Evaluation results of this resin plate are shown in Table 3. As is seen from Table 3, storage stability was over the desirable practical level of 72 hours at 90° C., and the developing time was reduced to ½ of that in Comparative Example 2.

EXAMPLE 8

A photosensitive resin plate was obtained in the same way as in Example 3 by further kneading 0.6 part by weight of bis(2-acrylolyloxyethyl) acid phosphate (BAOAP) with the photosensitive resin composition of Example 3 in a kneader. Evaluation results of this resin plate are shown in Table 3. As is seen from Table 3, storage stability was over the desirable practical level of 72 hours at 90° C., and the developing time was reduced to ½ of that in Comparative Example 2.

EXAMPLE 9

A photosensitive resin plate was made in the same way as in Example 3 by further kneading 0.6 part by weight of tri(2-acryloyloxyethyl) acid phosphate (TAOAP) with the photosensitive resin composition of Example 3 in a kneader. Evaluation results of this resin plate are shown in Table 3. As is seen from Table 3, storage stability was over the desirable practical level of 72 hours at 90° C., and the developing time was reduced to ½ of that in Comparative Example 2.

EXAMPLE 10

A photosensitive resin plate was obtained in the same way as in Example 3 by further kneading 0.6 part by weight of tetrakis(2,4-di-t-butylphenyl)-4,4'-biphenylene diphosphonate (TBBP) with the photosensitive resin composition of Example 3 in a kneader. Evaluation results of this resin plate are shown in Table 3. As is seen from Table 3, storage stability was over the desirable practical level of 72 hours at 90° C., and the developing time was reduced to ½ of that in Comparative Example 2.

EXAMPLE 11

A photosensitive resin plate was obtained in the same way as in Example 3 by further kneading 0.6 part by weight of mono(2-methacryloyloxyethyl) acid phosphate (MMOAP) with the photosensitive resin composition of Example 3 in a kneader. Evaluation results of this resin plate are shown in Table 3. As is seen from Table 3, storage stability was over the desired practical level of 72 hours at 90° C., and the developing time was reduced to ½ of that in Comparative Example 2.

EXAMPLE 12

A photosensitive resin plate was made in the same way as in Example 3 by further kneading 0.6 part by weight of bis(2-methacryloyloxyethyl) acid phosphate (BMOAP) with the photosensitive resin composition of Example 3 in a kneader. Evaluation results of this resin plate are shown in Table 3. As is seen from Table 3, storage stability was over the desirable practical level of 72 hours at 90° C., and the developing time was reduced to ½ of that in Comparative Example 2.

EXAMPLE 13

A photosensitive resin plate was obtained in the same way as in Example 3 by further kneading 0.6 part by weight of tri(2-methacryloyloxyethyl) acid phosphate (TMIOAP) with the photosensitive resin composition of Example 3 in a kneader. Evaluation results of this resin plate are shown in Table 3. As is seen from Table 3, storage stability was over the desirable practical level of 72 hours at 90° C., and the developing time was reduced to ½ of that in Comparative Example 2.

EXAMPLE 14

A photosensitive resin plate was obtained in the same way as in Example 3 by further kneading 0.3 part of monomethyl acid phosphate (MMAP) and 0.3 part by weight of dimethyl acid phosphate (DMAP) with the photosensitive resin composition of Example 3 in a kneader. Evaluation results of this resin plate are shown in Table 3. As is seen from Table 3, storage stability was over the desirable practical level of 72 hours at 90° C., and the developing time was reduced to ½ of that in Comparative Example 2.

EXAMPLE 15

A photosensitive resin plate was made in the same way as in Example 3 by further kneading 0.3 part by weight of mono(2-methacryloyloxyethyl) acid phosphate (MMOAP) and 0.3 part by weight of bis(2-methacryloyloxyethyl) acid phosphate (BMOAP) with the photosensitive resin composition of Example 3 in a kneader. Evaluation results of this resin plate are shown in Table 3. As is seen from Table 3, storage stability was over the desirable practical level of 72 hours at 90° C., and the developing time was reduced to ⅓ of that in Comparative Example 2.

EXAMPLE 16

A photosensitive resin plate was obtained in the same way as in Example 2 by further kneading 0.3 part by weight of monoisodecyl phosphate (MIDP) with the photosensitive resin composition of Example 2 in a kneader. Evaluation results of this resin plate are shown in Table 3. As is seen from Table 3, storage stability was over the desirable practical level of 72 hours at 90° C., and the developing time was reduced to ½ of that in Comparative Example 2.

COMPARATIVE EXAMPLES 2–8

In 100 parts by weight of the photosensitive resin composition of Referential Example 1(2), stabilizers were blended in the amounts (parts by weight) shown in Table 2, and each mixture was sandwiched between a PET film having an adhesive layer and another PET film having an anti-block coating to obtain a 3 mm thick photosensitive resin plate. Evaluation results of the thus obtained photosensitive resin plates are shown in Table 3. As is seen from Table 3, storage stability was very low, Although some of these resin plates showed a comparatively high storage stability, they incurred a drop of sensitivity and were unsuited for practical use.

INDUSTRIAL APPLICABILITY

The present invention provides a photosensitive resin composition which, as it contains a specific stabilizer, is resistant against tinting or gelation by heat, excellent in storage stability, not inhibitory to photopolymerization reactions, and thermally stable.

TABLE 1-1

| | Compounds added* | | | | Gelation time (hr) | Influence on sensitivity |
|---|---|---|---|---|---|---|
| | BBHS (parts by weight) | BBHMMA (parts by weight) | Others | (parts by weight) | | |
| Example 1-1 | 0.1 | 0 | | 0 | 15 | ○ |
| Example 1-2 | 0.4 | 0 | | 0 | 18 | ○ |
| Example 1-3 | 0.9 | 0 | | 0 | 30 | ○ |
| Example 1-4 | 2.5 | 0 | | 0 | 35 | ○ |
| Example 1-5 | 0.2 | 0.2 | | 0 | 20 | ○ |

TABLE 1-1-continued

| | Compounds added* | | | | Gelation time (hr) | Influence on sensitivity |
|---|---|---|---|---|---|---|
| | BBHS (parts by weight) | BBHMMA (parts by weight) | Others | (parts by weight) | | |
| Example 1-6 | 0.8 | 0.8 | | 0 | 45 | ○ |
| Comp. Example 1-1 | 0 | 0 | | 0 | 6 | ○ |
| Comp. Example 1-2 | 0 | 0.1 | | 0 | 8 | ○ |
| Comp. Example 1-3 | 0 | 0.9 | | 0 | 10 | ○ |
| Comp. Example 1-4 | 0 | 0 | 2,6-di-t-butylcresol | 0.4 | 7 | ○ |
| Comp. Example 1-5 | 0 | 0 | 4,4'-thiobis(3-methyl-6-t-butylphenol) | 0.4 | 9 | ○ |
| Comp. Example 1-6 | 0 | 0 | 2,2'-thiodiethylenebis(3-(3,5-di-t-butylhydroxyphenyl)-propionate) | 0.4 | 9 | ○ |
| Comp. Example 1-7 | 0 | 0 | 2,2'-thiodiethylenebis(3-(3,5-di-t-butyl-hydroxyphenyl)-propionate) | 5.0 | 15 | X |
| Comp. Example 1-8 | 0 | 0 | 2,2'-bis(1-hydroxy-4-methyl-6-t-butylphenyl)sulfide | 0.4 | 9 | ○ |
| Comp. Example 1-9 | 0 | 0 | Triethylene glycol bis(3-(3-t-butyl-5-methyl-4-hydroxy-phenyl)propionate | 0.4 | 9 | ○ |
| Comp. Example 1-10 | 0 | 0 | pentaerythrityl-tetrakis(3-(3,5-di-t-butyl-4-hydroxy-phenyl)propionate | 0.4 | 9 | ○ |

*Mixed in the amounts shown in the Table per 100 parts by weight of the photosensitive resin used in the Gelation Test.

TABLE 1-2

| | Compounds added* | | | | Gelation time (hr) | Influence on sensitivity |
|---|---|---|---|---|---|---|
| | BBHS (parts by weight) | BBHMMA (parts by weight) | Others | (parts by weight) | | |
| Comp. Example 1-11 | 0 | 0 | N,N'-hexamethylenebis(3,5-di-t-butyl-4-hydroxyhydro-cinnamide | 0.4 | 9 | ○ |
| Comp. Example 1-12 | 0 | 0 | 1,3,5-trimethyl-2,4,6-tris-(3,5-di-t-butyl-4-hydroxy-benzyl)benzene | 0.4 | 9 | ○ |
| Comp. Example 1-13 | 0 | 0 | N,N'-bis(3-(3,5-di-t-butyl-4-hydroxyphenyl)propionyl)-hydrazine | 0.4 | 9 | ○ |
| Comp. Example 1-14 | 0 | 0 | 1,1,3-tris(2-methyl-4-hydroxy-5-t-butylphenyl)butane | 0.4 | 9 | ○ |
| Comp. Example 1-15 | 0 | 0 | 4,4-butylidenebis(3-methyl-6-t-butylphenol) | 0.4 | 9 | ○ |
| Comp. Example 1-16 | 0 | 0 | Tetrakis(methylene-3-(3,5-di-t-butyl-4'-hydroxyphenyl) | 0.4 | 9 | ○ |
| Comp. Example 1-17 | 0 | 0 | 3,9-bis(1,1-dimethyl-2β(3-butyl-4-hydroxy-5-methyl-phenyl)propionyloxyethyl)-2,4,8,10-tetraoxaspiro-[5,5]undecane | 0.4 | 9 | ○ |
| Comp. Example 1-18 | 0 | 0.8 | 2,6-di-t-butylcresol | 0.4 | 10 | ○ |
| Comp. Example 1-19 | 0 | 0.8 | 2,2'-thiodiethylenebis(3-(3,5-di-t-butyl-hydroxyphenyl)-propionate | 0.4 | 10 | ○ |
| Comp. Example 1-20 | 0 | 0.8 | N,N'-hexamethylenebis(3,5-di-t-butyl-4-hydroxyhydro-cinnamide) | 0.4 | 10 | ○ |
| Comp. Example 1-21 | 0 | 0.8 | 1,3,5-trimethyl-2,4,6-tris-(3,5-di-t-butyl-4-hydroxy-benzyl)benzene | 0.4 | 10 | ○ |

*Mixed in the amounts shown in the Table per 100 parts by weight of the photosensitive resin used in the Gelation Test.

TABLE 2

Stabilizers added to 100 parts by weight of photosensitive resin composition obtained in Referential Example 1(2)

| | Phosphorus compound of this invention (parts by weight) | BBHS (parts by weight) | BBHMMA (parts by weight) | Other compounds | (parts by weight) |
|---|---|---|---|---|---|
| Example 2 | 0 | 1.2 | 0 | | 0 |
| Example 3 | 0 | 0.6 | 0.6 | | 0 |
| Example 4 | MIDP: 0.3 | 0.6 | 0.6 | | 0 |
| Example 5 | MMAP: 0.6 | 0.6 | 0.6 | | 0 |
| Example 6 | DMAP: 0.6 | 0.6 | 0.6 | | 0 |
| Example 7 | MAOAP: 0.6 | 0.6 | 0.6 | | 0 |
| Example 8 | BAOAP: 0.6 | 0.6 | 0.6 | | 0 |
| Example 9 | TAOAP: 0.6 | 0.6 | 0.6 | | 0 |
| Example 10 | TBBP: 0.6 | 0.6 | 0.6 | | 0 |
| Example 11 | MMOAP: 0.6 | 0.6 | 0.6 | | 0 |
| Example 12 | BMOAP: 0.6 | 0.6 | 0.6 | | 0 |
| Example 13 | TMIOAP: 0.6 | 0.6 | 0.6 | | 0 |
| Example 14 | MMAP: 0.3 DMAP: 0.3 | 0.6 | 0.6 | | 0 |
| Example 15 | MMOAP: 0.3 BMOAP: 0.3 | 0.6 | 0.6 | | 0 |
| Example 16 | MIDP: 0.3 | 1.2 | 0 | | 0 |
| Comp. Example 2 | 0 | 0 | 0 | | 0 |
| Comp. Example 3 | MIDP: 0.3 | 0 | 0 | | 0 |
| Comp. Example 4 | MIDP: 0.3 | 0 | 1.2 | | 0 |
| Comp. Example 5 | 0 | 0 | 0 | 2,2'-thiodiethylenebis(3-(3,5-di-t-butylhydroxyphenyl)propionate | 0.4 |
| Comp. Example 6 | MIDP: 0.3 | 0 | 0 | 2,2'-thiodiethylenebis(3-(3,5-di-t-butylhydroxyphenyl)propionate | 0.4 |
| Comp. Example 7 | MIDP: 0.3 | 0 | 1.2 | 2,2'-thiodiethylenebis(3-(3,5-di-t-butylhydroxyphenyl)propionate | 0.4 |
| Comp. Example 8 | MIDP: 0.3 | 0 | 1.2 | 2,2'-thiodiethylenebis(3-(3,5-di-t-butylhydroxyphenyl)propionate | 5.0 |

TABLE 3

| | Storage stability (development deterioration time) | | | | | Developing time (min/mm) | Influence on sensitivity |
|---|---|---|---|---|---|---|---|
| | 20° C. (months) | 40° C. (months) | 90° C. (hr) | 110° C. (hr) | 140° C. (hr) | | |
| Example 2 | 12≧ | 6 | 24 | 8 | 2 | 6 | ○ |
| Example 3 | 12≧ | 6 | 24 | 8 | 2 | 6 | ○ |
| Example 4 | 12≧ | 12≧ | 120≧ | 18 | 3 | 3 | ⊙ |
| Example 5 | 12≧ | 12≧ | 120≧ | 18 | 3 | 3 | ⊙ |
| Example 6 | 12≧ | 12≧ | 120≧ | 18 | 3 | 3 | ⊙ |
| Example 7 | 12≧ | 12≧ | 120≧ | 18 | 3 | 3 | ⊙ |
| Example 8 | 12≧ | 12≧ | 120≧ | 18 | 3 | 3 | ⊙ |
| Example 9 | 12≧ | 12≧ | 120≧ | 18 | 3 | 3 | ⊙ |
| Example 10 | 12≧ | 12≧ | 120≧ | 18 | 3 | 3 | ⊙ |
| Example 11 | 12≧ | 12≧ | 120≧ | 18 | 3 | 3 | ⊙ |
| Example 12 | 12≧ | 12≧ | 120≧ | 18 | 3 | 3 | ⊙ |
| Example 13 | 12≧ | 12≧ | 120≧ | 18 | 3 | 3 | ⊙ |
| Example 14 | 12≧ | 12≧ | 120≧ | 18 | 3 | 2 | ⊙ |
| Example 15 | 12≧ | 12≧ | 120≧ | 18 | 3 | 2 | ⊙ |
| Example 16 | 12≧ | 12≧ | 120≧ | 16 | 3 | 3 | ⊙ |
| Comp. Example 2 | 3 | 1 | 6 | 2 | 0.5 | 6 | ○ |
| Comp. Example 3 | 6 | 1 | 8 | 3 | 0.5 | 5 | ⊙ |
| Comp. Example 4 | 6 | 1 | 8 | 3 | 0.5 | 4 | ⊙ |
| Comp. Example 5 | 6 | 1 | 6 | 2 | 0.5 | 6 | ○ |

TABLE 3-continued

| | Storage stability (development deterioration time) | | | | | Developing | Influence |
|---|---|---|---|---|---|---|---|
| | 20° C. (months) | 40° C. (months) | 90° C. (hr) | 110° C. (hr) | 140° C. (hr) | time (min/mm) | on sensitivity |
| Comp. Example 6 | 6 | 1 | 8 | 3 | 0.5 | 5 | ⊙ |
| Comp. Example 7 | 6 | 1 | 8 | 3 | 0.5 | 5 | ⊙ |
| Comp. Example 8 | 12 | 3 | 15 | 6 | 1.5 | 5 | X |

What is claimed is:

1. A photosensitive resin composition containing bis(3,5-di-t-butyl-4-hydroxybenzyl)sulfide.

2. A photosensitive resin composition according to claim 1, containing 2-t-butyl-6-(3-t-butyl-2-hydroxy-5-methylbenzyl)-4-alkylphenyl acrylate.

3. A photosensitive resin composition according to claim 1 or 2, containing a thermoplastic elastomer and at least one phosphorus compound selected from the group consisting of monoisodecyl phosphate, monomethyl acid phosphate, dimethyl acid phosphate, mono(2-(meth)acryloyloxyethyl)acid phosphate, bis(2-(meth)acryloyloxyethyl)acid phosphate, tri(2-(meth)acryloyloxyethyl) acid phosphate, and tetrakis(2,4-di-t-butylphenyl)-4,4'-biphenylene diphosphonate.

* * * * *

UNITED STATES PATENT AND TRADEMARK OFFICE
CERTIFICATE OF CORRECTION

PATENT NO.    : 6,383,716 B1
DATED         : May 7, 2002
INVENTOR(S)   : Takeshi Oyoshi et al.

It is certified that error appears in the above-identified patent and that said Letters Patent is hereby corrected as shown below:

<u>Title page,</u>
Item [30], Foreign Application Priority Data, delete Item in its entirety.

Signed and Sealed this

Third Day of December, 2002

JAMES E. ROGAN
*Director of the United States Patent and Trademark Office*